United States Patent [19]
Lo

[11] Patent Number: 5,811,727
[45] Date of Patent: Sep. 22, 1998

[54] IN-LINE COUPLER

[76] Inventor: Jeffrey Lo, 11980 Telegraph Rd., #103, Santa Fe Springs, Calif. 90670

[21] Appl. No.: 543,575

[22] Filed: Oct. 16, 1995

[51] Int. Cl.$^6$ ................................................ H01B 11/06
[52] U.S. Cl. .............................. 174/36; 174/250; 174/261
[58] Field of Search .......................... 174/36, 68.1, 261, 174/250, 253, 268, 117 F, 117 FF, 72 TR

[56] References Cited

U.S. PATENT DOCUMENTS

| | | | |
|---|---|---|---|
| 3,267,402 | 8/1966 | Reimer | 336/200 |
| 3,818,117 | 6/1974 | Reyner, II et al. | 174/36 |
| 3,876,964 | 4/1975 | Balaster et al. | 174/68.5 |
| 4,748,293 | 5/1988 | Kikuchi et al. | 174/117 FF |

*Primary Examiner*—Kristine L. Kincaid
*Assistant Examiner*—Marc D. Machtinger
*Attorney, Agent, or Firm*—Michael D. Bednarek; Kilpatrick Stockton LLP

[57] ABSTRACT

An in-line coupler including a base plate for connecting a first connector and a second connector. The base plate has a first plate surface and a second plate surface. A number of nodes are provided at a first end of the base plate for connecting the first connector on the first plate surface and at a second end of the base plate for connecting the second connector on the second plate surface. A plurality of transmission lines are provided on the base plate for connecting the nodes at the first end to the nodes at the second end. The transmission lines have a compact configuration to reduce their mutual interference, thus reducing the attenuation of signals therein.

12 Claims, 12 Drawing Sheets

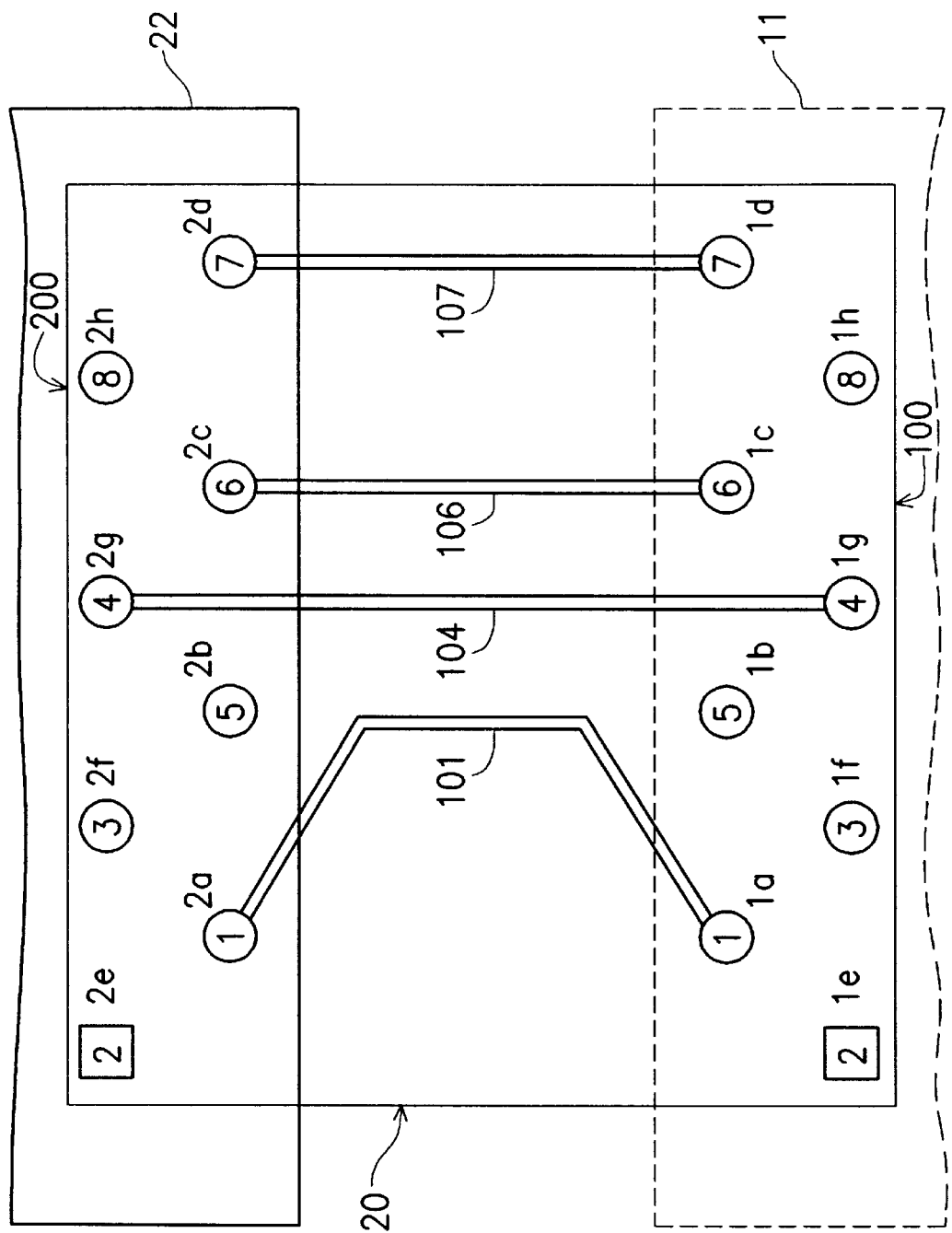

IN-LINE COUPLER

BACKGROUND OF THE INVENTION

1. Field of the Invention

The present invention relates to an in-line coupler, and more specifically, to a coupler for connecting two connectors with minimal attenuation.

2. Technical Background

An ideal data communication system provides not only a high data transmission rate but perfect signal waveforms. Since the signals are transported through media such as twisted pairs, coaxial cables, optical fibers or even microwaves, some non-ideal factors existing therein may affect the precision of transmitted signals. For example, the near end cross talk (NEXT) effect will occur between adjacent cables having equivalent signal frequencies. The NEXT effect causes interferences of signals in the cables and generates noises therein. In addition, the impedance of the transmitter and transmission medium must be compatible. Return loss due to discontinuity of impedance in the transmission lines will cause reflected signals and thus increase power consumption. Furthermore, as the transmission distance increases, the signal strength and power will decay, i.e., attenuation of the signals will occur.

The unshielded twisted pair (UTP), which has the simplest structure among all transmission media, consists of two copper wires twisted together. Even though the two wires are isolated, the crosstalk between the wires may occur as a result of the capacitance coupling effect, especially when the signal frequencies are very high. In addition, the impedance of the wires increases as the data rate increases, thus further increasing the attenuation speed of the signals.

Accordingly, a series of transmission standards, such as TSB36, TSB40, or TSB40-A, have been proposed in technical systems bulletins by the Telecommunications Industry Association (TIA) and Electronic Industry Association (EIA) to limit the attenuation of transmission media to an acceptable range. For example, the TSB40-A standard which defines various categories of 100-ohm-impedance UTP lines based on their attenuation in decibel units (dB) is listed in Table 1, and the properties and maximum transmission rate of each category are shown in Table 2.

TABLE 1

| Transmission Rate (MHz) | Category 3 (dB) | Category 4 (dB) | Category 5 (dB) |
| --- | --- | --- | --- |
| 1.0 | 0.4 | 0.1 | 0.1 |
| 4.0 | 0.4 | 0.1 | 0.1 |
| 8.0 | 0.4 | 0.1 | 0.1 |
| 10.0 | 0.4 | 0.1 | 0.1 |
| 16.0 | 0.4 | 0.2 | 0.2 |
| 20.0 | — | 0.2 | 0.2 |
| 25.0 | — | — | 0.2 |
| 31.25 | — | — | 0.2 |
| 62.5 | — | — | 0.3 |
| 100.0 | — | — | 0.4 |

TABLE 2

| UTP | Properties | maximum transmission rate |
| --- | --- | --- |
| Category 3 UTP | a PVC covered cable consisting of 4 twisted copper wires with an impedance of 100 ohms | 10 Mbps |
| Category 4 UTP | a PVC covered cable consisting of 4 twisted copper wires with an impedance of 100 ohms | 16 Mbps |
| Category 5 UTP | a PVC covered cable consisting of 4 twisted copper wires with an impedance of 100 ohms | 100 Mbps |

However, even though all transmission media satisfy the standards defined in Tables 1 and 2, if any two sections of the transmission medium are connected through a coupler without a specific configuration, signals transmitted therein will be affected by the coupler, thus causing a rapid attenuation of the signals. For example, referring to FIG. 1, a conventional in-line coupler consisting of connectors 1 and 2 connected by transmission lines 3 is illustrated. Since the transmission lines 3 are not arranged in a proper configuration, the high-frequency signals therein interfere with each other. Therefore, the qualities of the signals are affected. That is, the in-line coupler shown in FIG. 1 cannot satisfy the standard defined in Table 1 and Table 2 due to the transmission line configuration. Accordingly, in order to improve the signal quality of the in-line coupler, a specific arrangement of the transmission line configuration is required.

SUMMARY OF THE INVENTION

The present invention provides an in-line coupler to connect two connectors through a plurality of transmission lines on a base plate for reducing the signal attenuation.

The in-line coupler of the present invention includes a base plate for connecting a first connector and a second connector. The base plate has a first plate surface and a second plate surface. Eight nodes 1a, 1b, 1c, 1d, 1e, 1f, 1g and 1h are provided at a first end of the base plate for connecting the first connector on the first plate surface. Eight nodes 2a, 2b, 2c, 2d, 2e, 2f, 2g and 2h are provided at a second end of the base plate for connecting the second connector on the second plate surface. A plurality of transmission lines are provided on the base plate for connecting nodes 1a to 2a, 1b to 2b, 1c to 2c, 1d to 2d, 1e to 2e, 1f to 2f, 1g to 2g and 1h to 2h. The transmission lines have a compact configuration to reduce their mutual interference, thus reducing the attenuation of signals therein.

BRIEF DESCRIPTION OF THE DRAWINGS

The detailed description is made with reference to the accompanying drawings in which:

FIG. 3A and FIG. 3B illustrate the configuration of transmission lines according to one preferred embodiment of the invention;

DETAILED DESCRIPTION OF THE PREFERRED EMBODIMENTS

Figure 1:
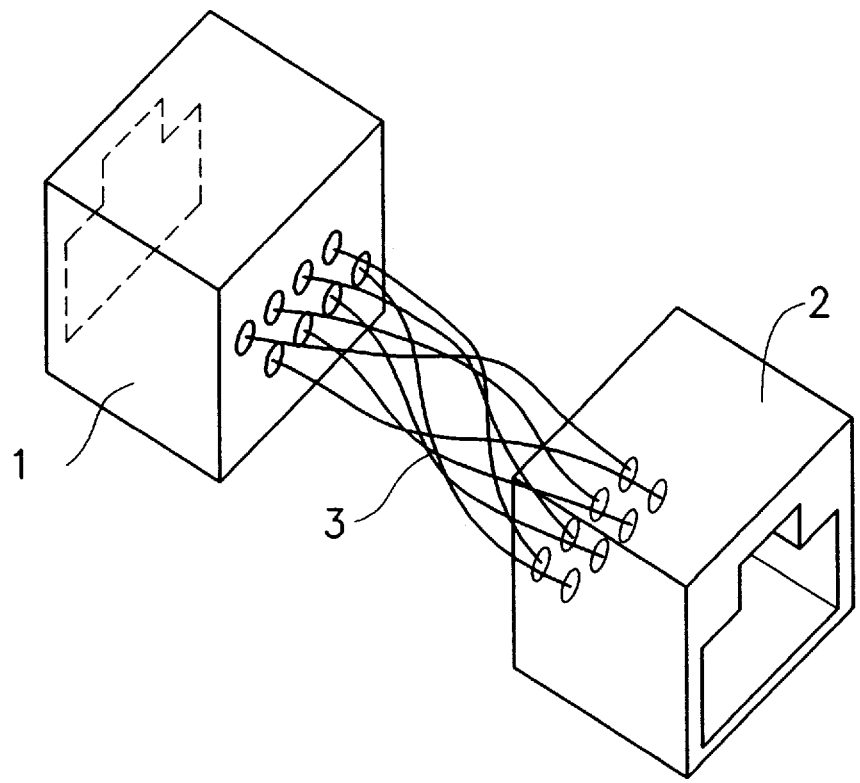
FIG. 1 illustrates the structure of a conventional in-line coupler.
Figure 2:
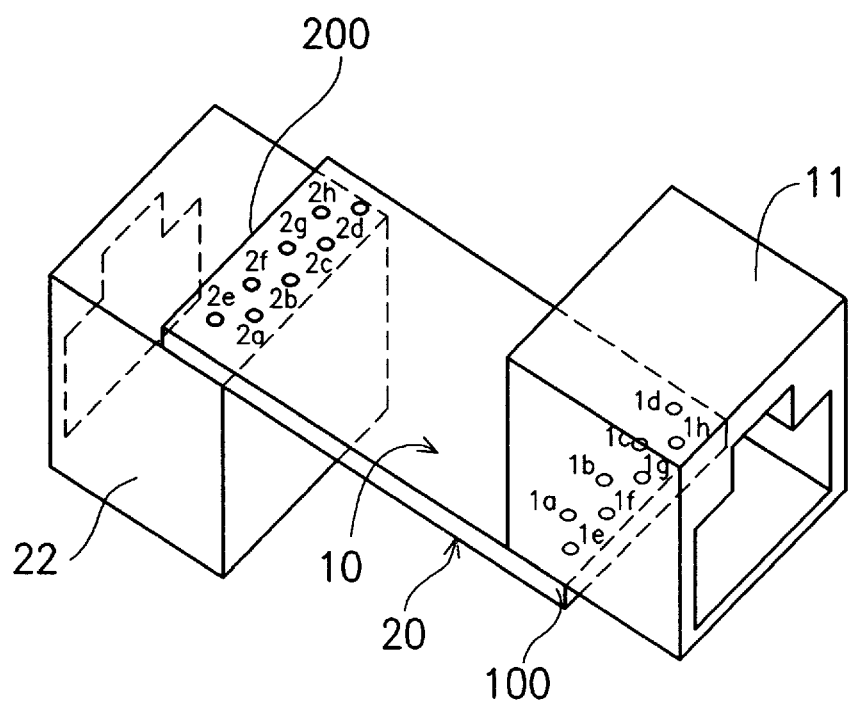
FIG. 2 illustrates the structure of an in-line coupler of the present invention.

Referring to FIG. 2, the in-line coupler of the present invention provides a base plate to connect a first connector 11 and a second connector 22. First connector 11 connects to the base plate at a first end 100 on a first surface 10. Second connector 22 connects the base plate at a second end 200 on a second plate surface 20. First end 100 of the base plate has a plurality of nodes, for example, eight nodes 1a through 1h for electrically connecting eight data lines of first connector 11. The second end of the base plate has also a plurality of nodes, for example, eight nodes 2a through 2h for electrically connecting eight data lines of second connector 22. Nodes 1a through 1h are connected respectively to nodes 2a through 2h by eight transmission lines (not shown in the figure) formed on the base plate. In the following paragraphs, there will be a more detailed description of the transmission lines.

Nodes 1a through 1h and nodes 2a through 2h are arranged in a predetermined configuration. As is depicted in FIG. 2, nodes 1a through 1d are in a first line, and nodes 1e through 1h are arranged in a second line. The first line and the second line are both parallel to the edge of first end 100. Each node in the first line is aligned at the center of the spacing between two neighboring nodes of the second line. The arrangement of nodes 2a through 2h is similar to that of nodes 1a through 1h. Since each node on first end 100 (or second end 200) connects to a data line of connector 11 (or connector 22), the relationships between the nodes and the data lines (numerated from 1 to 8) are shown in Table 3. The correspondence between nodes 2a-2h and data lines 1-8 of connector 22 is identical to those shown in Table 3.

TABLE 3

| node | data line | node | data line |
|------|-----------|------|-----------|
| 1a   | 1         | 1e   | 2         |
| 1b   | 5         | 1f   | 3         |
| 1c   | 6         | 1g   | 4         |
| 1d   | 7         | 1h   | 8         |

As a plurality of transmission lines on the first plate surface or the second plate surface of the base plate are provided for connecting nodes 1a to 2a, 1b to 2b, 1c to 2c, 1d to 2d, 1e to 2e, 1f to 2f, 1g to 2g and 1h to 2h, the configuration of the transmission lines according to one preferred embodiment of the present invention will now be explained in accompaniment with the schematic diagrams of FIG. 3A and FIG. 3B.

Figure 3A:
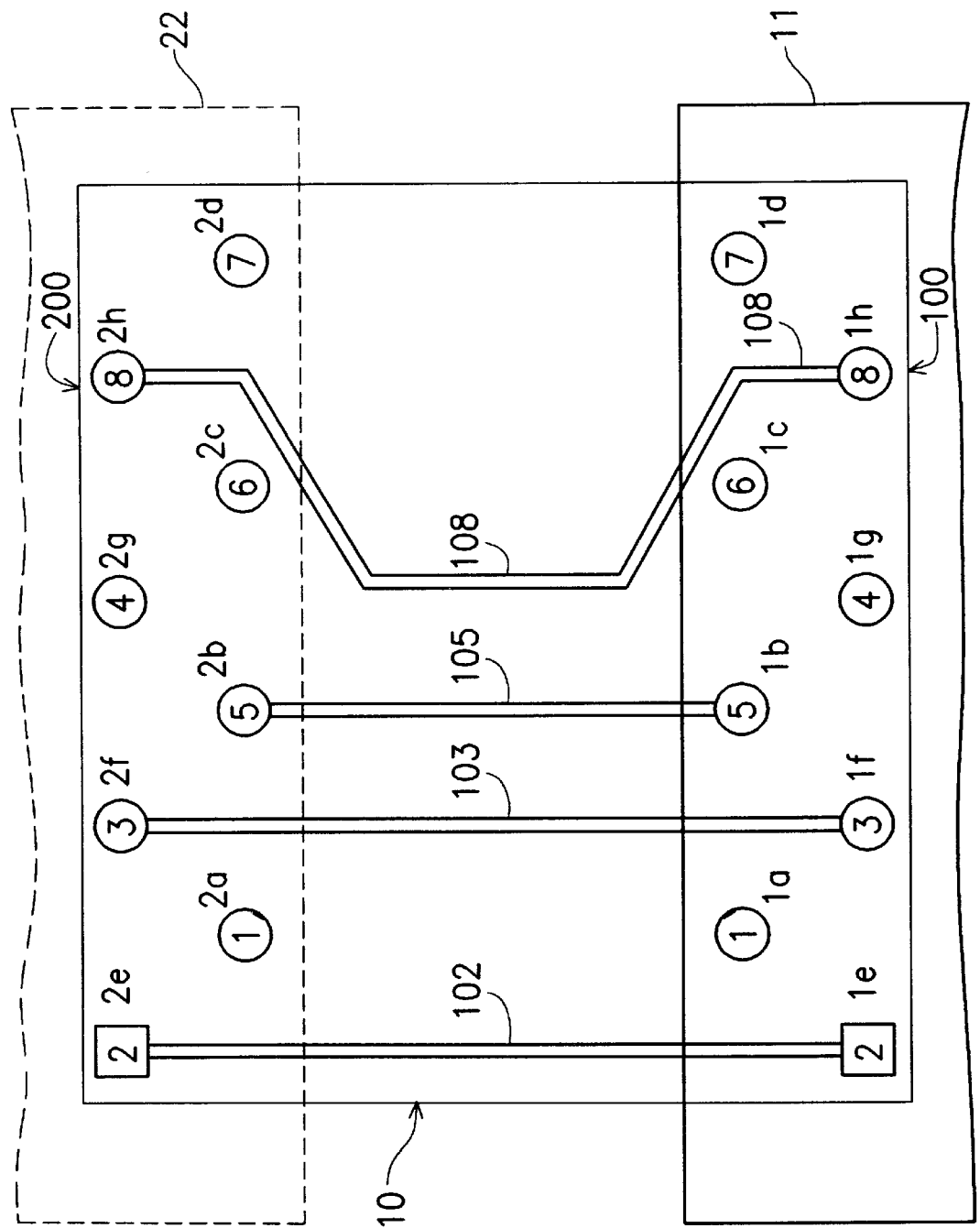

Referring to FIG. 3A and FIG. 3B, four transmission lines on both first plate surface 10 and second plate surface 20 of the base plate are depicted. The transmission lines, from a first transmission line 101 to an eighth transmission line 108, each correspond to one of data lines 1-8 of first connector 11 as well as second connector 22, thus connecting nodes 1a-1h to nodes 2a-2h respectively. On first plate surface 10 shown in FIG. 3A, second transmission line 102 electrically connects node 1b and node 2b, third transmission line 103 electrically connects node 1c and node 2c, fifth transmission line 105 electrically connects node 1e and node 2e, and eighth transmission line 108 connects node 1h and node 2h.

On second plate surface 20 shown in FIG. 3B, first transmission line 101 electrically connects node 1a and node 2a, fourth transmission line 104 electrically connects node id and node 2d, sixth transmission line 106 electrically connects node if and node 2f, and seventh transmission line 107 electrically connects node 1g and node 2g.

Referring again to FIG. 3A, first 102, third 103 and fifth 105 transmission lines are all straight lines between the nodes they connected. Eighth transmission line 108 is composed of five straight line segments, a first line segment through a fifth line segment. The first segment is in parallel to other transmission lines on the same plate surface from node 1h to about the center of nodes 1c and 1d. The third segment is in parallel to the first line segment but is located between node 1g and node 2g. The fifth line segment is in parallel to the first line segment from node 2h to about the center of nodes 2c and 2d. The second line segment connects the first line segment to the third line segment. The fourth line segment connects the third line segment to the fifth line segment.

Referring to FIG. 3B, fourth 104, sixth 106 and seventh 107 transmission lines are all straight lines between the nodes they connect. First transmission line 101 is composed of three straight line segments, a first line segment through a third line segment. The second line segment is in parallel with other transmission lines on the same plate surface but is located between nodes 1b and 2b. The first line segment connects node 1a to the second line segment. The third line segment connects node 2a to the second line segment.

Figure 4A:
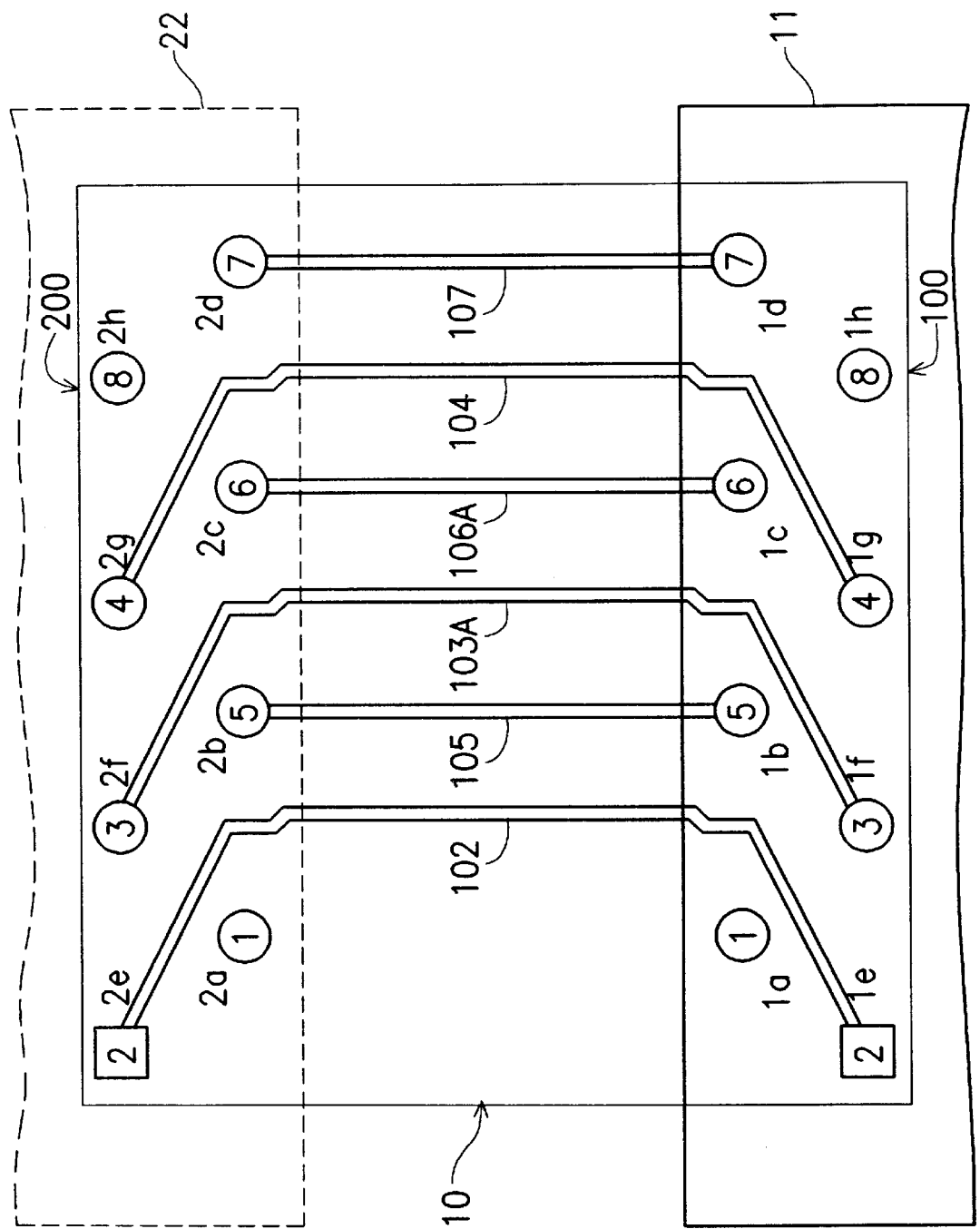
FIG. 4A and FIG. 4B illustrate the configuration of transmission lines according to another preferred embodiment of the present invention.
Figure 4B:
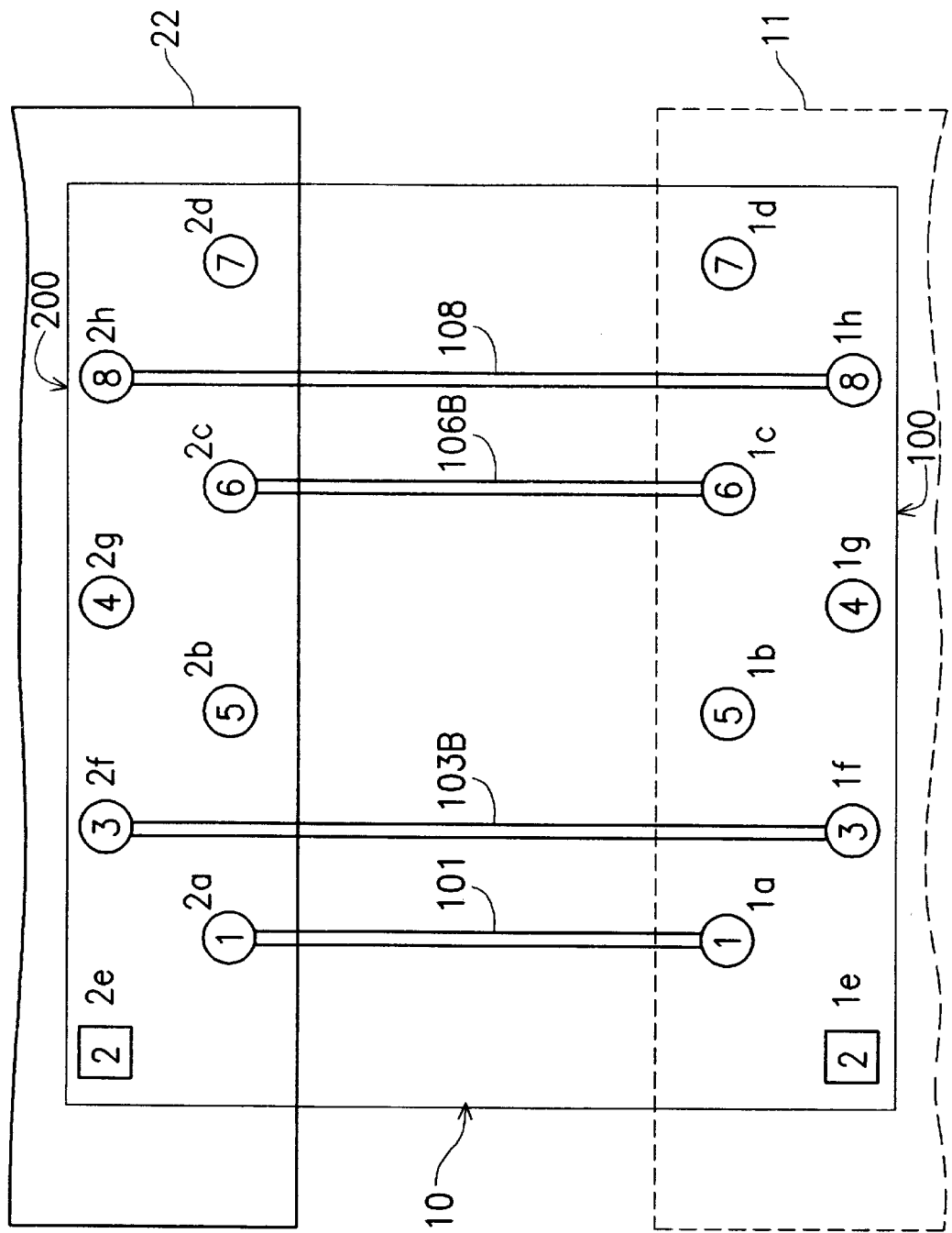

The transmission line configurations on plate surfaces 10 and 20 of the base plate according to another preferred embodiment of the present invention are illustrated in FIG. 4A and FIG. 4B, respectively. In the present embodiment, ten transmission lines, including a first transmission line 101 through an eighth transmission line 108, a ninth transmission line 106A and a tenth transmission line 103A, are provided to connect nodes 1a-1h to nodes 2a-2h. Since more transmission lines are provided in the present embodiment, the signal quality can be improved.

Referring to FIG. 4A, on first plate surface 10 of the base plate, second transmission line 102 electrically connects nodes 1b and 2b, fourth transmission line 104 electrically connects nodes 1d and 2d, fifth transmission line 105 electrically connects nodes 1d and 2d, seventh transmission line 107 electrically connects nodes 1g and 2g, ninth transmission line 106A electrically connects nodes 1f and 2f, and tenth transmission line 103A electrically connects nodes 1c and 2c.

Referring to FIG. 4B, on second plate surface 20 of the base plate, first transmission line 101 electrically connects nodes 1a and 2a, third transmission line 103 electrically connects nodes 1c and 2c, sixth transmission line 106 electrically connects nodes 1f and 2f, and eighth transmission line 108 electrically connects nodes 1h and 2h.

Again referring to FIG. 4A, fifth transmission line 105, ninth transmission line 106A and seventh transmission line 107 are all straight lines. In order to reduce the attenuation effect of the signals, second transmission line 102, tenth transmission line 103A and fourth transmission line 104 are arranged to minimize the straight transmission line distances. Therefore, in the present preferred embodiment, each of transmission lines 102, 103A and 104 is composed of three line segments. For example, a first segment of second transmission line 102 is from node 1e to about the middle of nodes 1a and 1b. A second segment is from node 2e to about the middle of nodes 2a and 2b. A third segment connects the first segment to the second segment. In addition, the middle portion of the third segment is slightly shifted to fifth transmission line 105. Similarly, a first segment of tenth transmission line 103A is from node 1f to about the middle of nodes 1b and 1c. A second segment is from node 2f to about the middle of nodes 2b and 2c. And, a third segment, whose middle portion is slightly shifted to ninth transmission line 106A, connects the first segment to the second segment. As to fourth transmission line 104, a first segment extends from node 1g to about the middle of nodes 1c and 1d, a second segment extends from node 2g to about the middle of nodes 2c and 2d, and a third segment connects the first segment to the second segment. The middle portion of the third segment is slightly shifted to seventh transmission line 107.

The in-line couplers of the aforementioned two embodiments are tested. For example, referring to FIG. 5A through FIG. 5F and FIG. 6A through FIG. 6F, wherein testing reports of the first embodiment are shown.

Figure 5A:
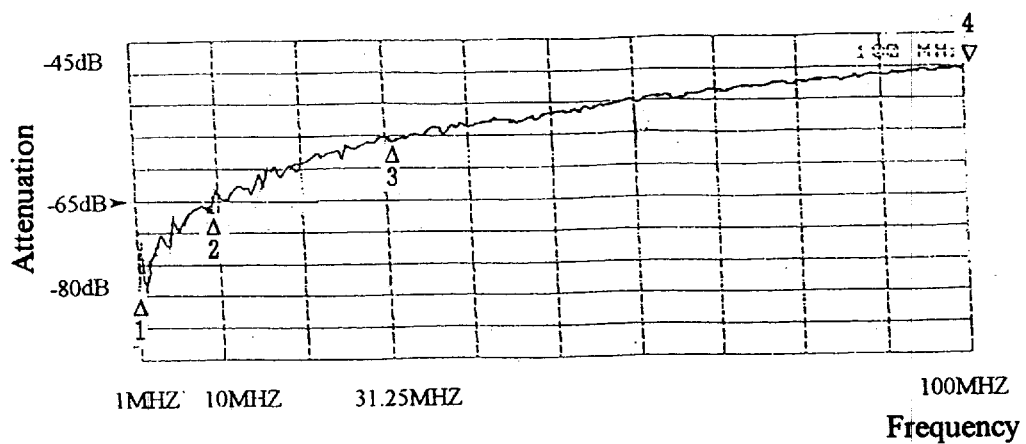
FIG. 5A through FIG. 5F are testing reports of the in-line coupler of FIG. 3A and FIG. 3B.
Figure 5B:
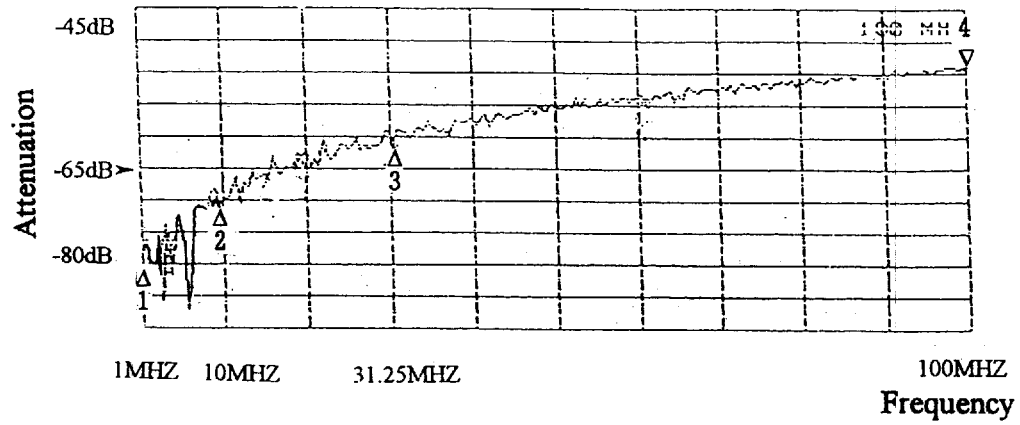

FIG. 5A and FIG. 5B are results of crosstalk tests under the conditions that the first node line and the second node line at each end 100 (200) has a distance of 2.54 mm, every two neighboring nodes in the same line have a distance of 2.54 mm, and the distance between the two first node lines at first end 100 and second 200, i.e., the distance between nodes 1a and 2a is 5.08 mm. Table 4 is an excerpt from the testing results.

TABLE 4

| FIG. | Transmission line | No. | Transmission Rate (MHz) | Attenuation (dB) |
|---|---|---|---|---|
| FIG. 5A | (1, 2) (3, 6) | 1 | 1 | −79.7 |
|  |  | 2 | 10 | −64.8 |
|  |  | 3 | 31.25 | −55.9 |
|  |  | 4 | 100 | −45.6 |
| FIG. 5B | (7, 8) (4, 5) | 1 | 1 | −79.7 |
|  |  | 2 | 10 | −68.6 |
|  |  | 3 | 31.25 | −60.7 |
|  |  | 4 | 100 | −49.3 |

Signal attenuation tests to every two transmission lines were also performed under the aforementioned conditions. The testing results are shown in FIG. 5C through FIG. 5F and some data are excerpted in Table 5.

TABLE 5

Figure 5C:
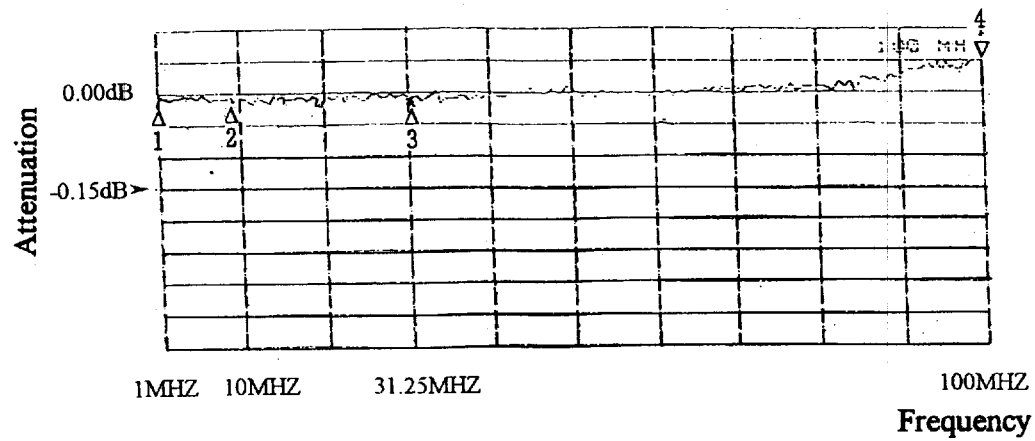
Figure 5D:
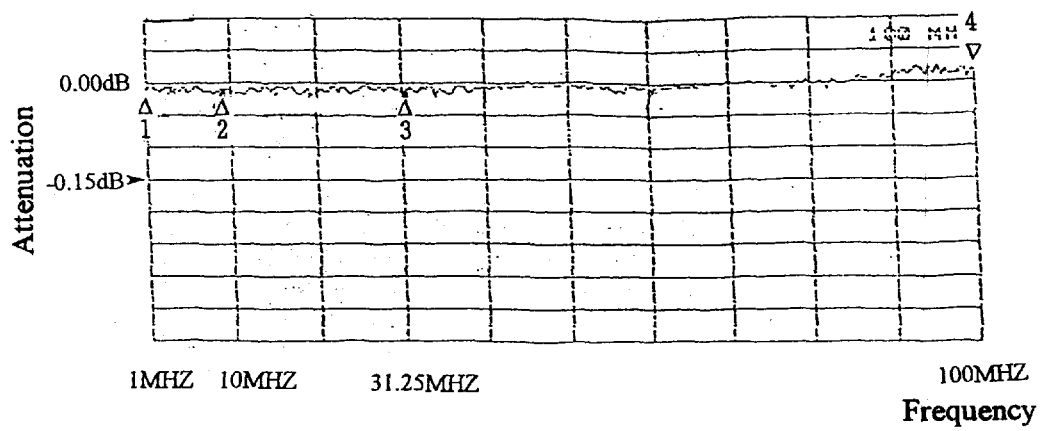
Figure 5E:
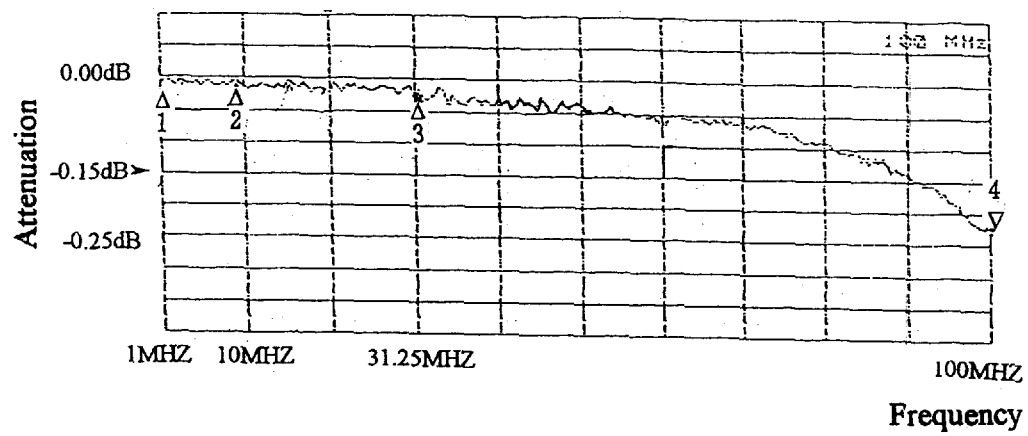
Figure 5F:
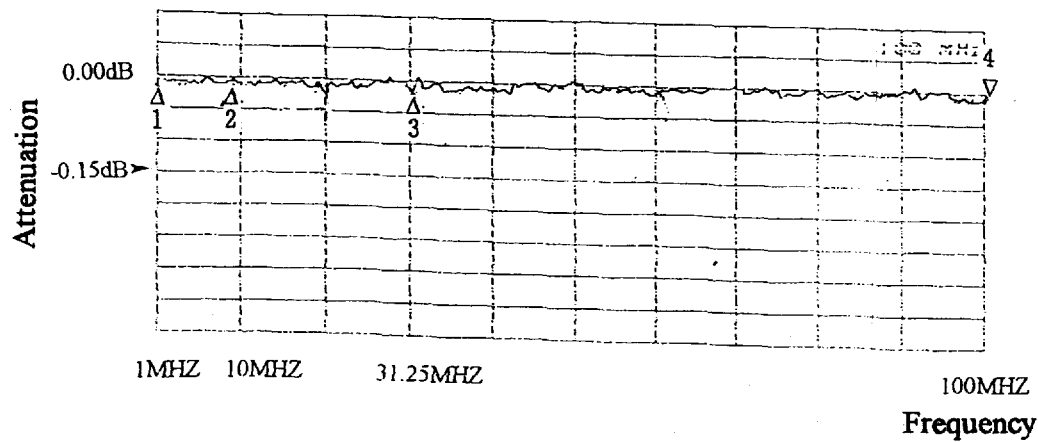

| FIG. | Transmission line |  | Transmission Rate (MHz) | Attenuation (dB) |
|---|---|---|---|---|
| FIG. 5C | 1, 2 | 1 | 1 | −0.016 |
|  |  | 2 | 10 | −0.006 |
|  |  | 3 | 31.25 | −0.003 |
|  |  | 4 | 100 | −0.049 |
| FIG. 5D | 7, 8 | 1 | 1 | −0..13 |
|  |  | 2 | 10 | −0.007 |
|  |  | 3 | 31.25 | −0.007 |
|  |  | 4 | 100 | −0.016 |
| FIG. 5E | 3, 6 | 1 | 1 | −0.015 |
|  |  | 2 | 10 | −0.009 |
|  |  | 3 | 31.25 | −0.017 |
|  |  | 4 | 100 | −0.230 |
| FIG. 5F | 4, 5 | 1 | 1 | −0.010 |
|  |  | 2 | 10 | −0.005 |
|  |  | 3 | 31.25 | −0.008 |
|  |  | 4 | 100 | −0.020 |

When the distance between the two first node lines at first end 100 and second end 200 is expanded to be 11.43 mm, another crosstalk test and signal attenuation test are performed. The testing results are shown in FIG. 6A and FIG. 6B (crosstalk test) and FIG. 6C–FIG. 6F (signal attenuation test), and some data are excerpted in Table 6 and Table 7.

TABLE 6

Figure 6A:
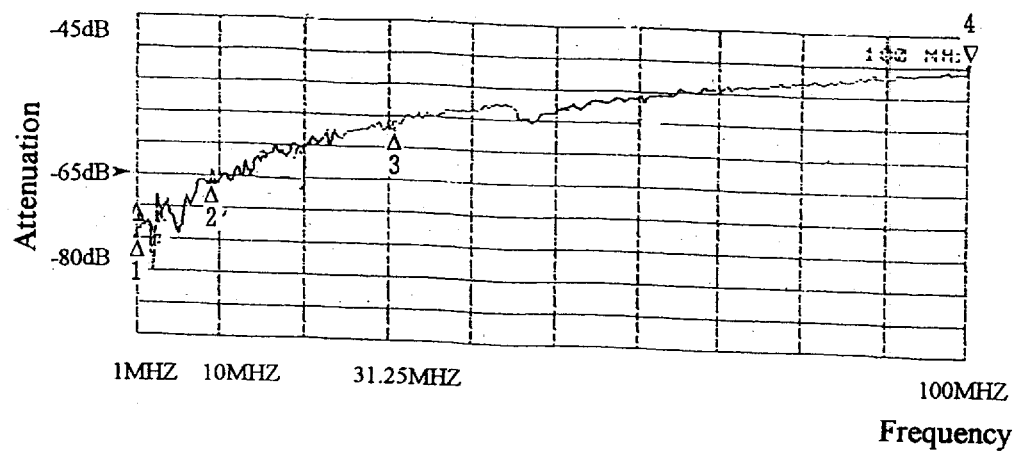
FIG. 6A through FIG. 6F are testing reports of the in-line coupler of FIG. 3A and FIG. 3B.
Figure 6B:
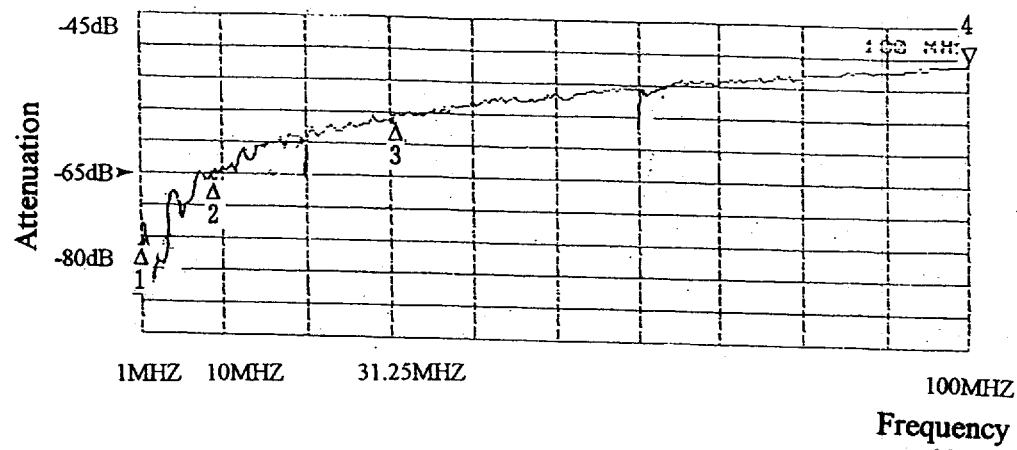

| FIG. | Transmission line |  | Transmission Rate (MHz) | Attenuation (dB) |
|---|---|---|---|---|
| FIG. 6A | 1, 2 - 3, 6 | 1 | 1 | −69.2 |
|  |  | 2 | 10 | −64.5 |
|  |  | 3 | 31.25 | −56.0 |
|  |  | 4 | 100 | −45.6 |
| FIG. 6B | 7, 8 - 4, 5 | 1 | 1 | −76.1 |
|  |  | 2 | 10 | −64.5 |
|  |  | 3 | 31.25 | −55.7 |
|  |  | 4 | 100 | −45.9 |

TABLE 7

Figure 6C:
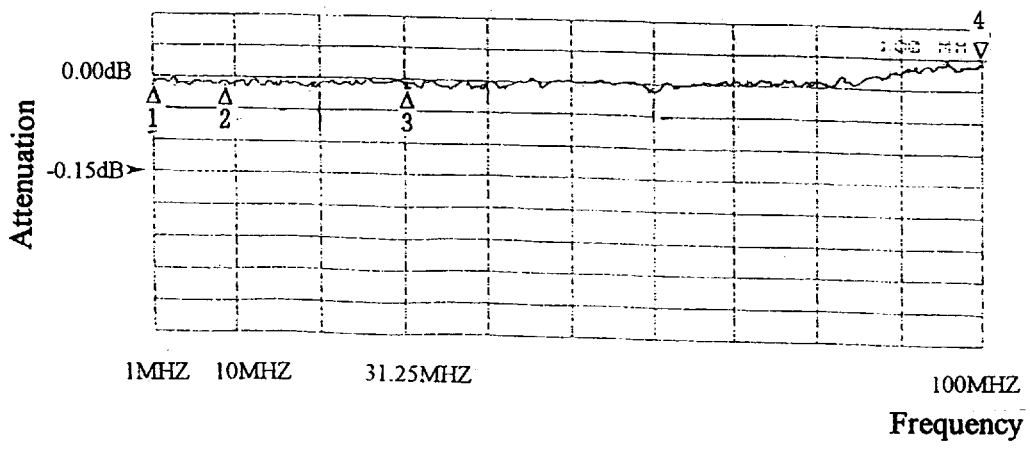
Figure 6D:
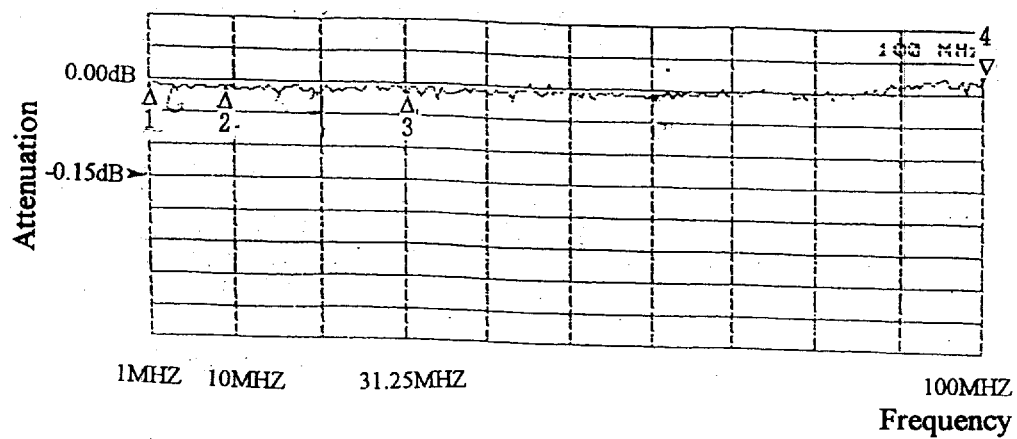
Figure 6E:
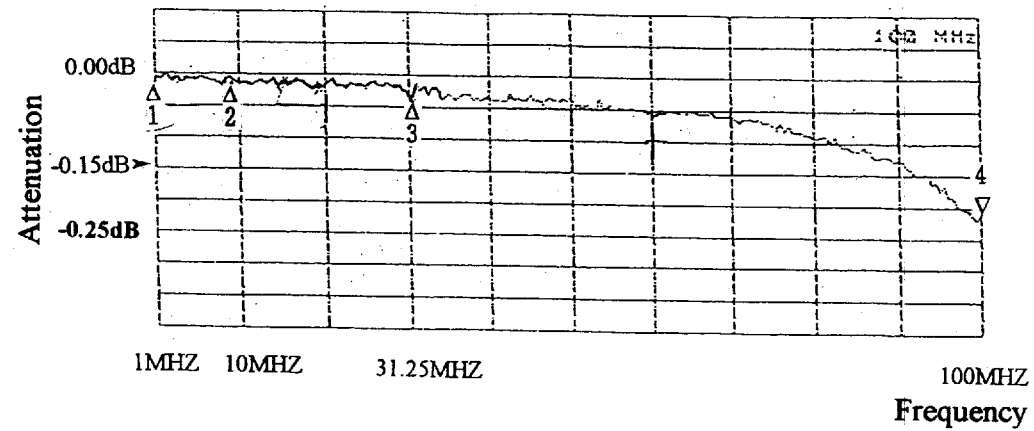
Figure 6F:
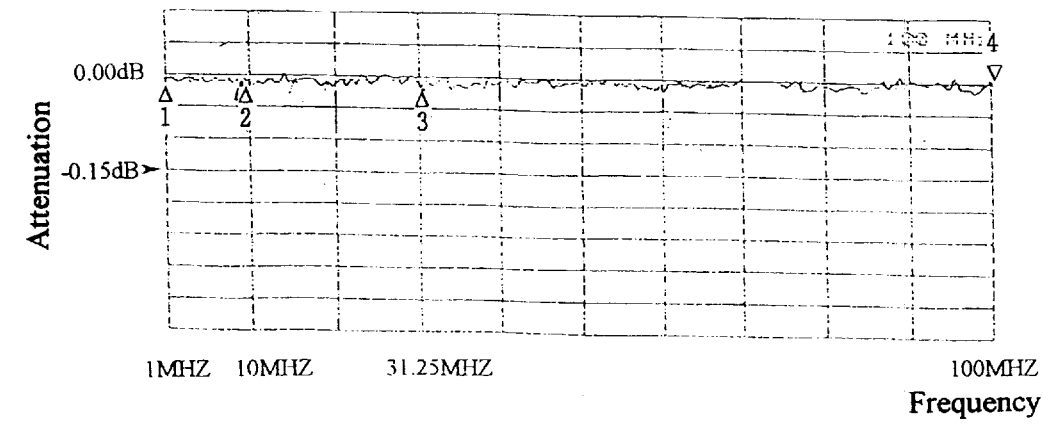

| FIG. | Transmission line |  | Transmission Rate (MHz) | Attenuation (dB) |
|---|---|---|---|---|
| FIG. 6C | 1, 2 | 1 | 1 | −0.014 |
|  |  | 2 | 10 | −0.003 |
|  |  | 3 | 31.25 | −0.004 |
|  |  | 4 | 100 | −0.038 |
| FIG. 6D | 7, 8 | 1 | 1 | −0.016 |
|  |  | 2 | 10 | −0.008 |
|  |  | 3 | 31.25 | −0.011 |
|  |  | 4 | 100 | −0.019 |
| FIG. 6E | 3, 6 | 1 | 1 | −0.014 |
|  |  | 2 | 10 | −0.008 |
|  |  | 3 | 31.25 | −0.027 |
|  |  | 4 | 100 | −0.208 |
| FIG. 6F | 4, 5 | 1 | 1 | −0.012 |
|  |  | 2 | 10 | −0.007 |
|  |  | 3 | 31.25 | −0.008 |
|  |  | 4 | 100 | −0.005 |

Figure 7A:
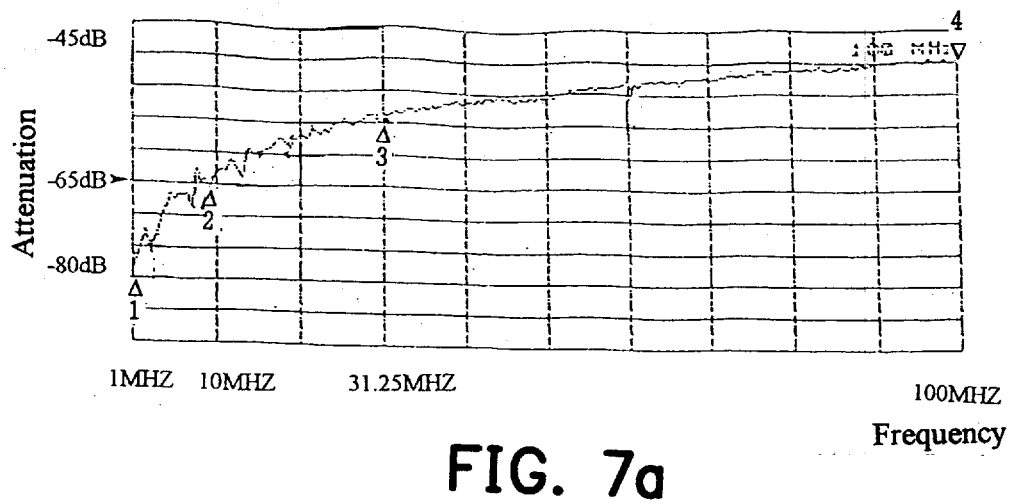
FIG. 7A through FIG. 7F are testing report of the in-line coupler of FIG. 4A and FIG. 4B.
Figure 7B:
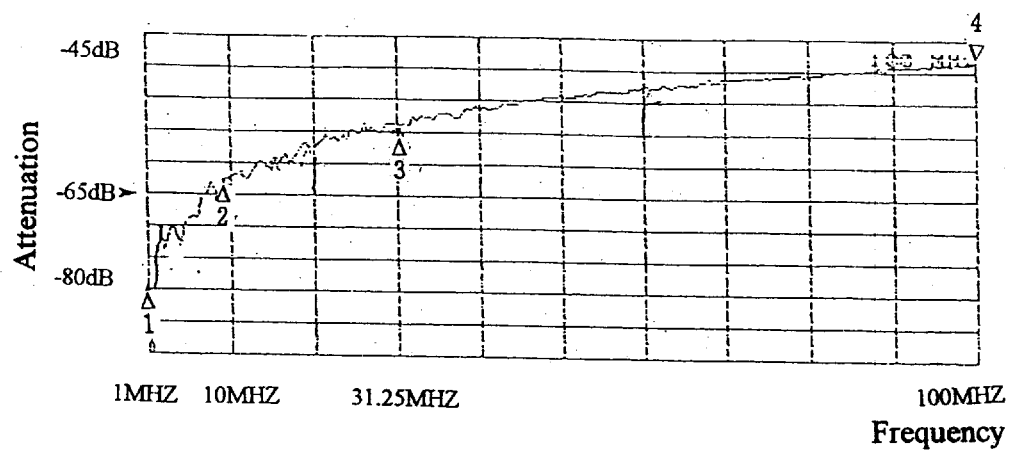

As to the second embodiment of the invention, the conditions that the first node line and the second node line at each end 100 (200) has a distance of 2.54 mm, every two neighboring nodes in the same line have a distance of 2.54 mm, and the distance between the two first node lines at first end 100 and second end 200 is 10.16 mm are applied to perform the crosstalk test and the signal attenuation test. The testing results are shown in FIG. 7A, FIG. 7B (crosstalk test) and FIG. 7C–FIG. 7F (signal attenuation test). Some of the testing results are excerpted in Table 8 and Table 9 for references.

TABLE 8

| FIG. | Transmission line |  | Transmission Rate (MHz) | Attenuation (dB) |
|---|---|---|---|---|
| FIG. 7A | 1, 2 - 3, 6 | 1 | 1 | −79.4 |
|  |  | 2 | 10 | −65.2 |
|  |  | 3 | 31.25 | −53.8 |
|  |  | 4 | 100 | −44.6 |
| FIG. 7B | 7, 8 - 4, 5 | 1 | 1 | −79.1 |
|  |  | 2 | 10 | −62.4 |
|  |  | 3 | 31.25 | −54.0 |
|  |  | 4 | 100 | −43.3 |

TABLE 9

Figure 7C:
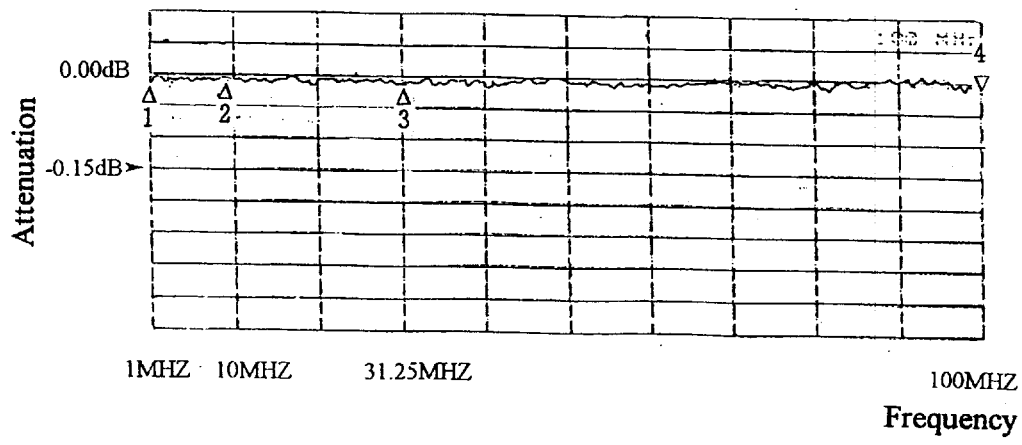

| FIG. | Transmission line |  | Transmission Rate (MHz) | Attenuation (dB) |
|---|---|---|---|---|
| FIG. 7C | 1, 2 | 1 | 1 | −0.013 |
|  |  | 2 | 10 | −0.007 |
|  |  | 3 | 31.25 | −0.007 |

TABLE 9-continued

Figure 7D:
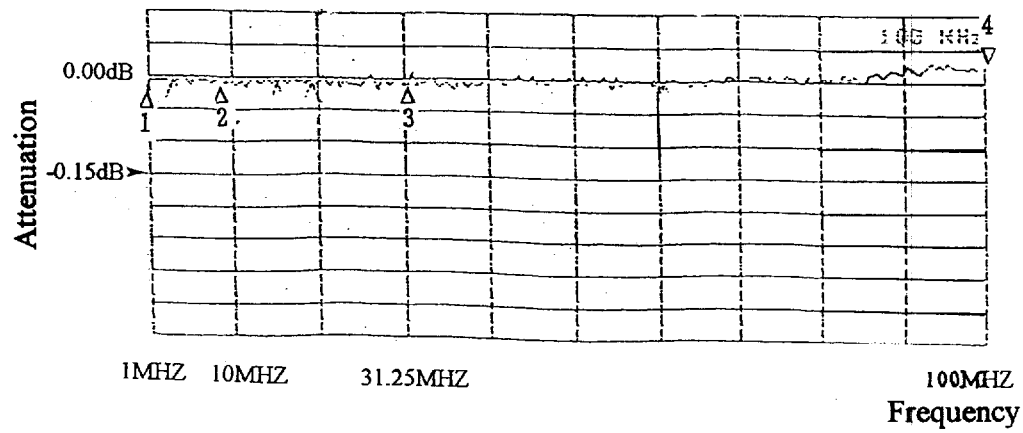
Figure 7E:
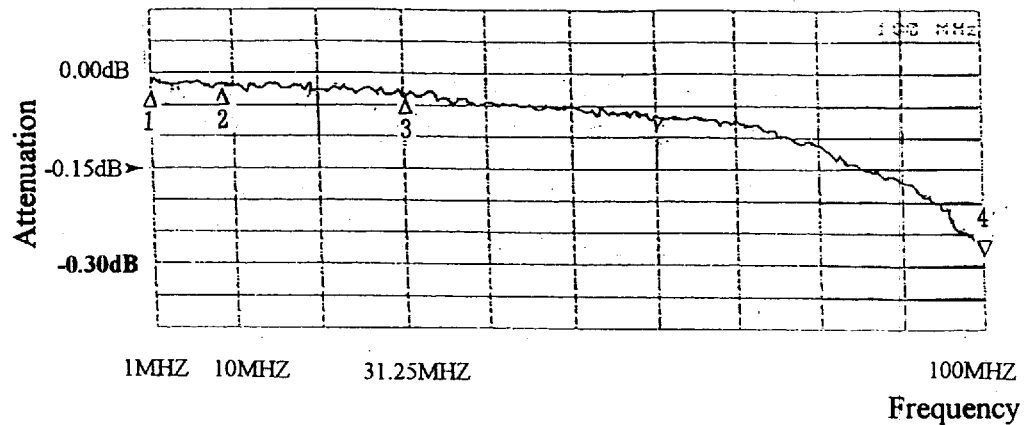
Figure 7F:
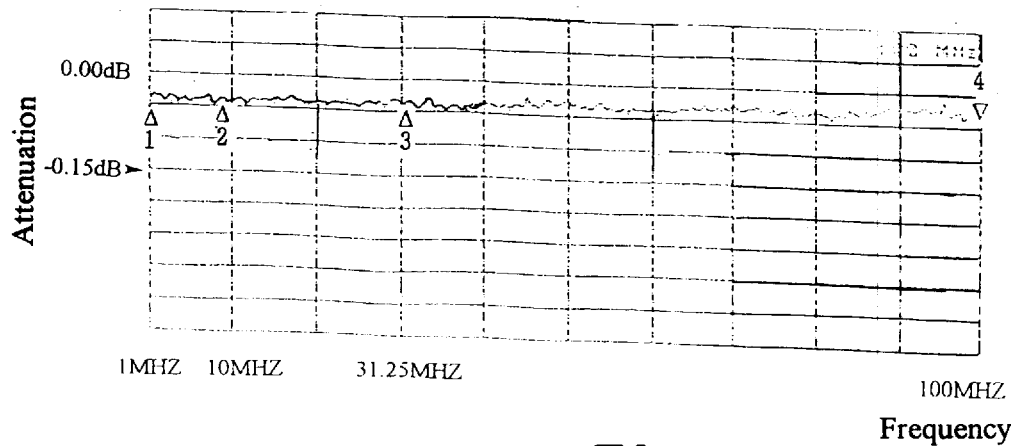

| FIG. | Transmission line | Transmission Rate (MHz) | Attenuation (dB) |
|---|---|---|---|
|  |  | 4 | 100 | −0.020 |
| FIG. 7D | 7, 8 | 1 | −0.010 |
|  |  | 2 | 10 | −0.003 |
|  |  | 3 | 31.25 | −0.004 |
|  |  | 4 | 100 | −0.024 |
| FIG. 7E | 3, 6 | 1 | 1 | −0.025 |
|  |  | 2 | 10 | −0.018 |
|  |  | 3 | 31.25 | −0.033 |
|  |  | 4 | 100 | −0.281 |
| FIG. 7F | 4, 5 | 1 | 1 | −0.045 |
|  |  | 2 | 10 | −0.038 |
|  |  | 3 | 31.25 | −0.036 |
|  |  | 4 | 100 | −0.037 |

As shown in FIG. 5A–FIG. 5F, FIG. 6A–FIG. 6F, FIG. 7A–FIG. 7F and Table 4–Table 9, the signal frequency can be as high as 100 MHz while the quality still satisfactorily meets the standards shown in Table 1 and Table 2. Since the base plate can be a printed circuit (PC) board, the cost to fabricate the in-line coupler can be reduced. Moreover, the transmission line configuration can be applied to any large computer network system for connecting signal lines therein. A perfect frequency range from 1 KHz to 100 MHz is provided by the in-line coupler of the present invention.

What is claimed is:

1. An in-line coupler for high speed data transmission UTP and STP, for connecting a first connector and a second connector, said in-line coupler comprising:

a base plate having a first plate surface and a second plate surface opposite to said first plate surface;

a first transmission line on said second surface for electrically connecting a first node at a first end of said base plate and a ninth node at a second end of the base plate;

a second transmission line on said first surface for electrically connecting a second node at said first end of said base plate and a tenth node at said second end of the base plate;

a third transmission line on said first surface for electrically connecting a third node at said first end of said base plate and an eleventh node at said second end of the base plate;

a fourth transmission line on said second surface for electrically connecting a fourth node at said first end of said base plate and a twelfth node at said second end of the base plate;

a fifth transmission line on said first surface for electrically connecting a fifth node at said first end of said base plate and a thirteenth node at said second end of the base plate;

a sixth transmission line on said second surface for electrically connecting a sixth node at said first end of said base plate and a fourteenth node at said second end of the base plate;

a seventh transmission line on said second surface for electrically connecting a seventh node at said first end of said base plate and a fifteenth node at said second end of the base plate; and an eighth transmission line on said first surface for electrically connecting an eighth node at said first end of said base plate and a sixteenth node at said second end of the base plate;

wherein said first node through said eighth node are different from each other, and said ninth node through said sixteenth node are different from each other.

2. The in-line coupler of claim 1, wherein said first transmission line, said third transmission line and said fifth transmission line are all straight lines between the nodes they connect.

3. The in-line coupler of claim 1, wherein said eighth transmission line is composed of five straight line segments, including: a first line segment from said eighth node to about the center between said third node and said fourth node; a third line segment in parallel to said first line segment but located between said seventh node and said fifteenth node; a fifth line segment in parallel to said first line segment from said sixteenth node to about the center of said eleventh node and said twelfth node; a second line segment connecting said first line segment to said third line segment; and a fourth line segment connecting said third line segment to said fifth line segment.

4. The in-line coupler of claim 1, wherein said fourth transmission line, said sixth transmission line and said seventh transmission line are all straight lines between the nodes they connect.

5. The in-line coupler of claim 1, wherein said first transmission line is composed of three straight line segments, including: a second line segment in parallel to other of said transmission lines on said second surface but laying between said second node and said tenth node; a first line segment connecting said first node to said second line segment; and a third line segment connecting said ninth node to said second line segment.

6. An in-line coupler for high speed data transmission UTP and STP, for connecting a first connector and a second connector, said in-line coupler comprising:

a base plate having a first plate surface and a second plate surface opposite to said first plate surface;

a first transmission line on said second surface for electrically connecting a first node at a first end of said base plate and a ninth node at a second end of said base plate;

a second transmission line on said first surface for electrically connecting a second node at said first end of the base plate and a tenth node at said second end of said base plate;

a third transmission line on said second surface for electrically connecting a third node at said first end of the base plate and an eleventh node at said second end of the said base plate;

a fourth transmission line on said first surface for electrically connecting a fourth node at said first end of said base plate and a twelfth node at said second end of said base plate;

a fifth transmission line on said first surface for electrically connecting a fifth node at said first end of said base plate and a thirteenth node at said second end of said base plate;

a sixth transmission line on said second surface for electrically connecting a sixth node at said first end of said base plate and a fourteenth node at said second end of said base plate;

a seventh transmission line on said first surface for electrically connecting a seventh node at said first end of said base plate and a thirteenth node at said second end of said base plate;

an eighth transmission line on said second surface for electrically connecting an eighth node at said first end of said base plate and a sixteenth node at said second end of said base plate;

a ninth transmission line on said first plate surface for electrically connecting said sixth node at said first end of said base plate and said fourteenth node at said second end of said base plate; and a tenth transmission line on said first plate surface for electrically connecting said third node at said first end of said base plate and said eleventh node at said second end of said base plate;

wherein said first node through said eighth node are different from each other, and said ninth node through said sixteenth node are different from each other.

7. The in-line coupler of claim 6, wherein said first transmission line, said third transmission line, said sixth transmission line and said eighth transmission line are all straight lines between the nodes they connect.

8. The in-line coupler of claim 6, wherein said fifth transmission line, said seventh transmission line and said ninth transmission line are all straight lines between the nodes they connect.

9. The in-line coupler of claim 6, wherein said second transmission line, said tenth transmission line and said fourth transmission line are composed of three line segments to minimize their distances to said fifth transmission line, said seventh transmission line and said ninth transmission line.

10. The in-line coupler of claim 9, wherein said second transmission line includes: a first segment from said fifth node to about the middle of said first node and said second node; a second segment extending from said thirteenth node to about the middle of said ninth node and said tenth node; and a third segment connecting the first segment to the second segment; wherein the middle portion of the third segment is slightly shifted to said fifth transmission line.

11. The in-line coupler of claim 9, wherein said tenth transmission line includes: a first segment from said sixth node to about the middle of said first node and said second node; a second segment extending from said fifteenth node to about the middle of second tenth node and said eleventh node; and a third segment connecting the first segment to the second segment; wherein the middle portion of the third segment is slightly shifted to said sixth transmission line.

12. The in-line coupler of claim 9, wherein said fourth transmission line includes: a first segment from said seventh node to about the middle of said third node and said fourth node; a second segment from said fifteenth node to about the middle of said eleventh node and twelfth node; and a third segment connecting the first segment to the second segment; wherein the middle portion of the third segment is slightly shifted to said seventh transmission line.

\* \* \* \* \*